United States Patent
Phillips et al.

(10) Patent No.: US 6,695,030 B1
(45) Date of Patent: Feb. 24, 2004

(54) APPARATUS FOR PERMITTING TRANSFER OF ORGANIC MATERIAL FROM A DONOR WEB TO FORM A LAYER IN AN OLED DEVICE

(75) Inventors: Bradley A. Phillips, Honeoye Falls, NY (US); David B. Kay, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/224,182

(22) Filed: Aug. 20, 2002

(51) Int. Cl.$^7$ .................. B32B 31/28; B32B 31/20; H01F 41/00; B05D 5/12; G03C 8/00
(52) U.S. Cl. ................ 156/540; 156/379.6; 156/379.8; 156/381; 156/382; 156/580; 427/457; 427/510; 427/162; 430/200; 430/201; 430/321; 346/105; 347/217
(58) Field of Search .................. 156/230, 234, 156/240, 247, 289, 277.2, 285, 376.9, 380.5, 381, 382, 540, 553, 580, 581, 379.8; 118/50, 50.1; 427/457, 492, 510, 472, 96, 167, 146, 147, 148; 428/195, 202, 914; 430/30, 7, 200, 201, 321; 347/217; 346/134, 76.1, 105

(56) References Cited

U.S. PATENT DOCUMENTS

| 4,314,814 A | * | 2/1982 | Deroode |
| 4,670,084 A | * | 6/1987 | Durand ..................... 156/540 |
| 5,342,817 A | * | 8/1994 | Sarraf ..................... 503/227 |
| 5,450,117 A | * | 9/1995 | Quanz ..................... 347/217 |
| 5,578,416 A | | 11/1996 | Tutt |
| 5,641,372 A | * | 6/1997 | Okuno ..................... 156/230 |
| 5,688,551 A | | 11/1997 | Littman et al. |
| 5,742,129 A | | 4/1998 | Nagayama et al. |
| 5,851,709 A | | 12/1998 | Grande et al. |
| 5,937,272 A | | 8/1999 | Tang |
| 6,114,088 A | | 9/2000 | Wolk et al. |
| 6,140,009 A | | 10/2000 | Wolk et al. |
| 6,194,119 B1 | | 2/2001 | Wolk et al. |
| 6,214,520 B1 | | 4/2001 | Wolk et al. |
| 6,221,553 B1 | | 4/2001 | Wolk et al. |

FOREIGN PATENT DOCUMENTS

EP  1 028 001  9/2000

OTHER PUBLICATIONS

IBM Technical Disclosure Bulletin, "Laser Desorption Transfer Sampling", TDB–ACC–NO: NN930587, vol. 36, No. 5, pp. 87–88 May 1,1993.*

* cited by examiner

Primary Examiner—J. A. Lorengo
(74) Attorney, Agent, or Firm—Raymond L. Owens

(57) ABSTRACT

Apparatus for transferring organic material from a donor web onto a substrate to form a layer of organic material on one or more OLED devices including a web of donor material; first and second fixtures and a structure for applying fluid to a chamber to containing the fixtures to apply pressure to the non-transfer surface of the donor web so as to ensure the position of the donor web relative to the substrate; the first fixture including a transparent portion located in relationship to the non-transfer surface of the donor web to permit transmission of radiation through such transparent portion to the non-transfer surface of the donor web so that heat will be produced and the organic material will transfer from the donor web to the substrate.

23 Claims, 8 Drawing Sheets

APPARATUS FOR PERMITTING TRANSFER OF ORGANIC MATERIAL FROM A DONOR WEB TO FORM A LAYER IN AN OLED DEVICE

CROSS REFERENCE TO RELATED APPLICATIONS

Reference is made to commonly assigned U.S. patent application Ser. No. 10/021,410 filed Dec. 12, 2001 by Phillips et al., the disclosure of which is incorporated herein by reference.

FIELD OF THE INVENTION

The present invention relates to organic electroluminescent (EL) devices, also known as organic light-emitting diodes (OLED), and particularly to apparatus, which facilitates forming organic layers in such devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium may consist of one or more layers of organic thin films, where one of the layers is primarily responsible for light generation or electroluminescence. This particular layer is generally referred to as the emissive layer of the organic EL medium. Other organic layers present in the organic EL medium may provide electronic transport functions primarily and are referred to as either the hole transport layer (for hole transport) or electron transport layer (for electron transport). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of ±5 micrometers) for accurately forming EL devices.

A method for patterning high-resolution organic EL displays has been disclosed in U.S. Pat. No. 5,851,709 by Grande et al. This method is comprised of the following sequences of steps: 1) providing a substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman in U.S. Pat. No. 5,688,551, and in a series of patents by Wolk et al. (U.S. Pat. Nos. 6,114,088; 6,140,009; 6,214,520; and 6,221,553).

In commonly assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material can be precoated on one surface of a donor support material and transferred to a substrate by vapor deposition in a selected pattern (as in FIGS. 4, 5, and 6 in the aforementioned U.S. Pat. No. 5,937,272).

The EL material transfer is preferably done in a vacuum chamber such as Tang describes in the aforementioned patent and, in particular, vacuum is preferably maintained between the donor and substrate. The donor and substrate must also be kept in close proximity during the EL transfer (less than 250 micrometers between the coating and raised portions of the substrate as taught by Tang). Furthermore, the donor may be in contact with the raised portions of the substrate and thereby maintain sufficient spacing between the coating and the recessed portions of the substrate where the EL material is deposited. In any case, a method of holding the donor and substrate in contact in a vacuum chamber while maintaining vacuum between the donor and substrate is required.

Isberg et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive.

Mechanical pressure, such as that applied by a manual plate, can be used but is difficult to maintain evenly over the entire surface for the micrometer-order tolerances needed. Pressure from air or other fluids would work better, but the use of such pressure is made difficult in that the conditions in the vacuum chamber need to remain undisturbed.

SUMMARY OF THE INVENTION

It is therefore an object of the present invention to provide a more effective way of positioning a donor web to an OLED substrate for facilitating the formation of one or more layers of organic material.

This object is achieved by an apparatus for transferring organic material from a donor web onto a substrate to form a layer of organic material on one or more OLED devices, comprising:

a) a web of donor material;
b) a first fixture arranged to engage the donor web and substrate in a relationship relative to one another whereby there will be either a separation between portions of the substrate and the donor web, or the substrate and donor web will be in contact, and wherein organic material will be transferred onto portions of the substrate;
c) a second fixture aligned with and engaging the first fixture to clamp the donor web and substrate and forming a chamber relative to a non-transfer surface of the donor web;
d) means for moving the donor web to position a portion of the donor web in the chamber at an organic material transfer position;
e) means for supplying a fluid to the chamber to apply pressure to the non-transfer surface of the donor web so as to ensure the position of the donor web relative to the substrate;
f) the first fixture including a transparent portion located in relationship to the non-transfer surface of the donor web to permit transmission of radiation through such transparent portion to the non-transfer surface of the donor web so that heat will be produced and the organic material will transfer from the donor web to the substrate; and
g) means including a laser light source that is directed through the transparent portion to illuminate the donor web in a pattern which will cause the appropriate transfer of the organic material to the substrate.

ADVANTAGES

An advantage to the present invention is that by using a web of donor material the productivity of manufacturing OLED devices is increased. The apparatus maintains a uniform spacing between a donor material and a substrate in an ambient vacuum or vacuum environment and where it is further preferred that vacuum be maintained between the donor and substrate. This provides for suitable clamping in an environment (vacuum) that is advantageous for lowering contamination. A further advantage is that this method can be fully automated including donor web and substrate media handling, providing for higher throughput. The present invention is particularly suitable for forming organic layers over a large area having a number of OLED display devices, which are in the process of being formed. A further advantage of this invention is that it allows for the manufacture of large amounts of organic donor material that can be stored until needed.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary color from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel that can be independently addressable to emit a specific color. For example, a blue subpixel is that portion of a pixel that can be addressed to emit blue light. In a full-color display, a pixel generally comprises three primary color subpixels, namely blue, green, and red. The term "pitch" is used to designate the distance separating two pixels or subpixels in a display panel. Thus, a subpixel pitch means the separation between two subpixels. The term "vacuum" is used herein to designate a pressure of 1 Torr or less. The terms "organic material" and "donor material" will be used interchangeably and refer to components used in the fabrication of OLED devices in the practice of this invention.

Phillips et al. in commonly assigned U.S. patent application Ser. No. 10/021,410 filed Dec. 12, 2001, the disclosure of which is incorporated herein by reference, have disclosed an apparatus that provides pressure to one side of a donor element, thus promoting close contact between the donor element and a substrate, while maintaining a vacuum between the substrate and the donor element, and facilitating transfer on that side. While this is a useful apparatus, it relies on the use of individual sheets of donor elements. Such an apparatus will have limited throughput capabilities.

Figure 1:
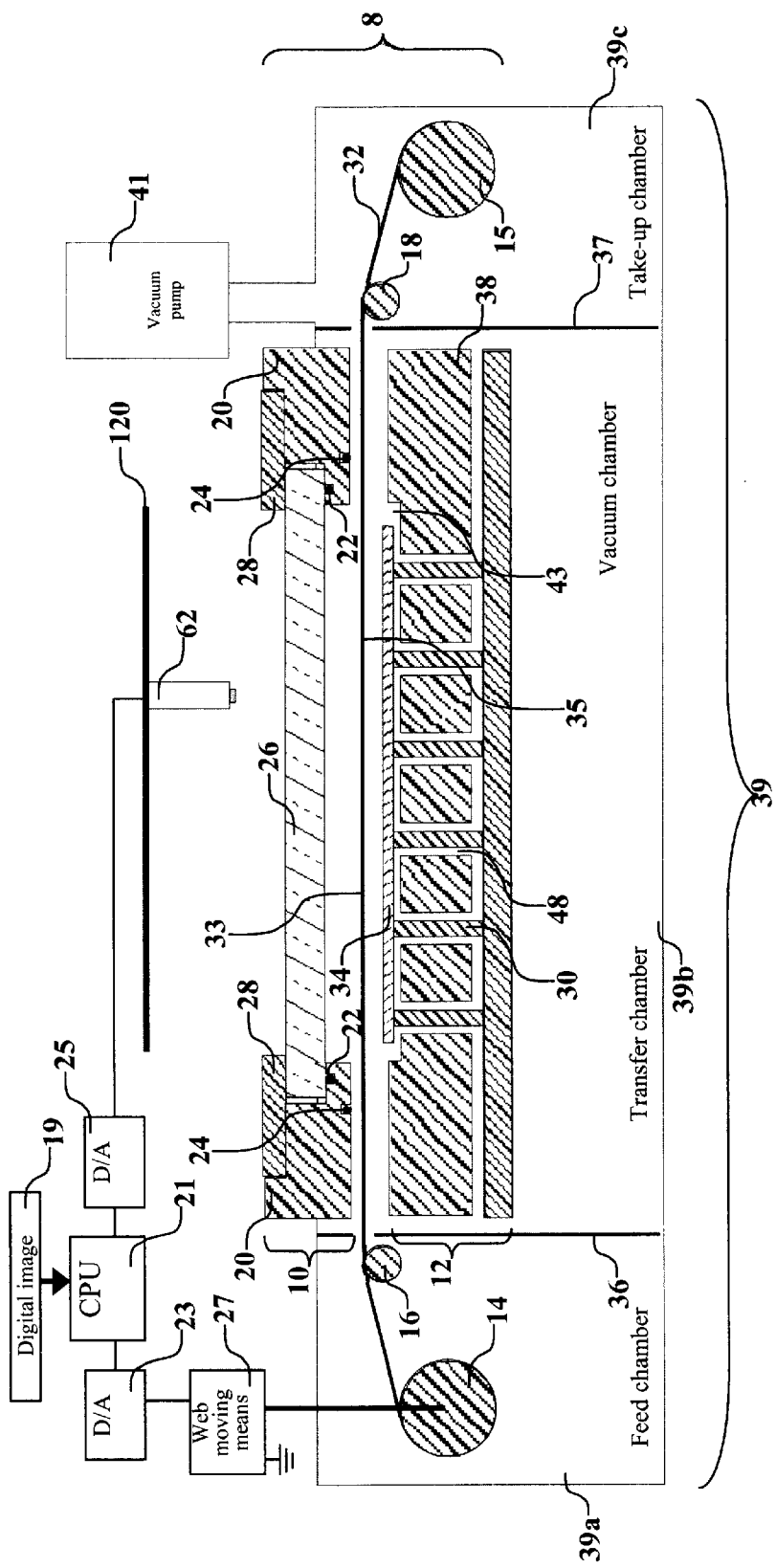
FIG. 1 is a cross-sectional representation of one embodiment of an apparatus with a vacuum chamber designed in accordance with this invention.

Turning now to FIG. 1, there is shown a cross-sectional representation of one embodiment of an apparatus 8 in an open position provided in a vacuum chamber and designed in accordance with this invention. A first fixture 10 includes top plate 20 which, in this particular example, is an open rectangular plate that has been machined for the features to be described here. First fixture 10 is incorporated into vacuum chamber 39, which can be held under vacuum by vacuum pump 41. This is advantageous for certain types of transfer for several reasons: 1) the transfer across a non-contact gap is more effective under vacuum; and 2) some donor materials are sensitive to oxygen, moisture, or other contaminants. First fixture 10 is arranged in a manner to engage donor web 32 and substrate 34 in a relationship relative to one another. In such a manner, as will become apparent, the substrate 34 and the donor web 32 will be in contact, or there will be a separation between portions of substrate 34 and donor web 32, which will permit organic material on donor web 32 to be transferred to portions of substrate 34.

First fixture 10 includes transparent portion 26, which can be in the form of a plate as depicted here or other convenient shape and is fitted into top plate 20. Transparent portion 26 is formed of a material that is transparent to radiation of a predetermined portion of the spectrum and therefore permits the transmission of such radiation. Transparent portion 26 is located in relationship to non-transfer surface 33 of donor web 32 in a way that permits the transmission of radiation through transparent portion 26 to non-transfer surface 33 of donor web 32 so that heat will be produced. Transparent portion 26 fits into top plate 20 and compresses gasket 22, which fits into a slot that has been machined for it. Transparent portion 26 is held in top plate 20 by means of retaining clamp 28, which is held to top plate 20 by means of screws or other fasteners (not shown). Transparent portion 26, gasket 22, and top plate 20 form an airtight seal. An airtight seal is defined herein as having no fluid leaks or having a sufficiently low leak rate as to not adversely affect the environmental conditions within the vacuum chamber. Top plate 20 has another machined slot, which holds gasket 24.

A second fixture 12 is aligned with first fixture 10 and includes plate 38. Second fixture 12, when engaged with first fixture 10 in a manner that will become apparent, clamps donor web 32 and substrate 34 to compress gasket 24 and to create an airtight chamber between non-transfer surface 33 of donor web 32 and transparent portion 26. Plate 38 is made of a rigid material, such as steel or rigid plastic, and is preferably flat to within the focal depth of a laser. Channel array 48 allows pin array 30 to support substrate 34 when apparatus 8 is in the open position. This facilitates transfer of substrate 34 into and out of apparatus 8 by automated means such as robotic means. When plate 38 rises to engage with top plate 20, substrate 34 is lifted from pin array 30 and held within cavity 43 of plate 38.

Apparatus 8 uses a donor in the form of a web, which is a continuous flexible material which includes donor material and which can be used repeatedly as a donor by moving the web to a fresh portion. Donor web 32 is pre-wound into donor roll 14 to a specified roll diameter or web length (typically several thousand feet of web length) and spans through apparatus 8 to take-up roll 15. When apparatus 8 is in the open position, donor web 32 can be indexed such that an unused portion of donor web 32 is positioned within apparatus 8. By unused portion we mean a portion of donor web 32 where no organic material transfer has taken place. After a transfer of organic material from donor web 32 to substrate 34 is complete, apparatus 8 can be opened and donor web 32 can be indexed until the next unused portion is positioned within apparatus 8. Donor roll 14 and take-up roll 15 can be mounted on motorized spindles to facilitate transport of donor web 32 through apparatus 8. The path of donor web 32 can also include idler rollers 16 and 18. In addition, idler roller 16 or 18 can include a tension transducer to provide a feedback signal for controlling, for example, the relative rotational speeds of donor roll 14 and take-up roll 15 for proper tension of donor web 32. A variety of other rollers for web speed control, web support and guidance, tension isolation, web accumulation, web cooling, web drive and transport, etc. can also be included in the web path. Gate valves 36 and 37 can also be provided, which create feed chamber 39a, transfer chamber 39b, and take-up chamber 39c and serve to isolate the environments of these chambers from each other. This can be important in some cases such as maintaining vacuum on apparatus 8 when replenishing donor roll 24. Transparent portion 26 is a material transparent to the impinging radiation and structurally sufficient to withstand a pressure difference of at least 1 atmosphere between opposing sides. One example is an optical BK-7 glass made by Schott Glass Technologies, Inc., which is prepared to be optically clear to laser light and may include anti-reflectant surface treatment. The thickness of transparent portion 26 is determined by its material properties, the pressure difference, and the overall exposed area.

A laser light source 62 is mounted on micropositioning device 120 in such a way that it can irradiate through any desired part of transparent portion 26. Radiation from laser light source 62 is directed through transparent portion 26 to illuminate donor web 32 in a pattern to cause the appropriate transfer of organic material from donor web 32 to substrate 34 at the desired locations. Laser light source 62 emits radiation in a predetermined portion of the spectrum, e.g. infrared or visible.

A means for moving donor web 32 is necessary. Web moving means 27 comprises e.g. a motor. Web moving means 27 can position a portion of donor web 32 at an organic material transfer position. An organic material transfer position is herein defined as a position wherein the portion can be illuminated by laser light source 62 through transparent portion 26 and wherein organic material can be transferred from donor web 32 to substrate 34.

A means for controlling web moving means 27 and actuating laser light source 62 can further be included. Movement and positioning in apparatus 8 can be controlled by computer 21 in response to digital image 19. Computer 21, through digital/analog converter 23, controls web moving means 27, which in turn controls the motion of donor roll 24. Although not shown, other web moving means controlled by computer 21 can control other parts of apparatus 8, such as take-up roll 15 or an optional web drive roller. Computer 21 can also, through digital/analog converter 25, control micropositioning device(s) 120 and actuate laser light source 62 in response to digital image 19.

Substrate 34 can be an organic solid, an inorganic solid, or a combination of organic and inorganic solids that provides a surface for receiving the emissive material from a donor and may be rigid or flexible. Typical substrate materials include glass, plastic, metal, ceramic, semiconductor, metal oxide, semiconductor oxide, semiconductor nitride, circuit board materials or combinations thereof. Substrate 34 may be a homogeneous mixture of materials, a composite of materials, or multiple layers of materials. Substrate 34 can be an OLED substrate, that is, a substrate commonly used for preparing OLED devices. In one preferred embodiment, substrate 34 comprises a matrix array of thin film transistors (TFTs). Substrate 34 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective.

Figure 2:
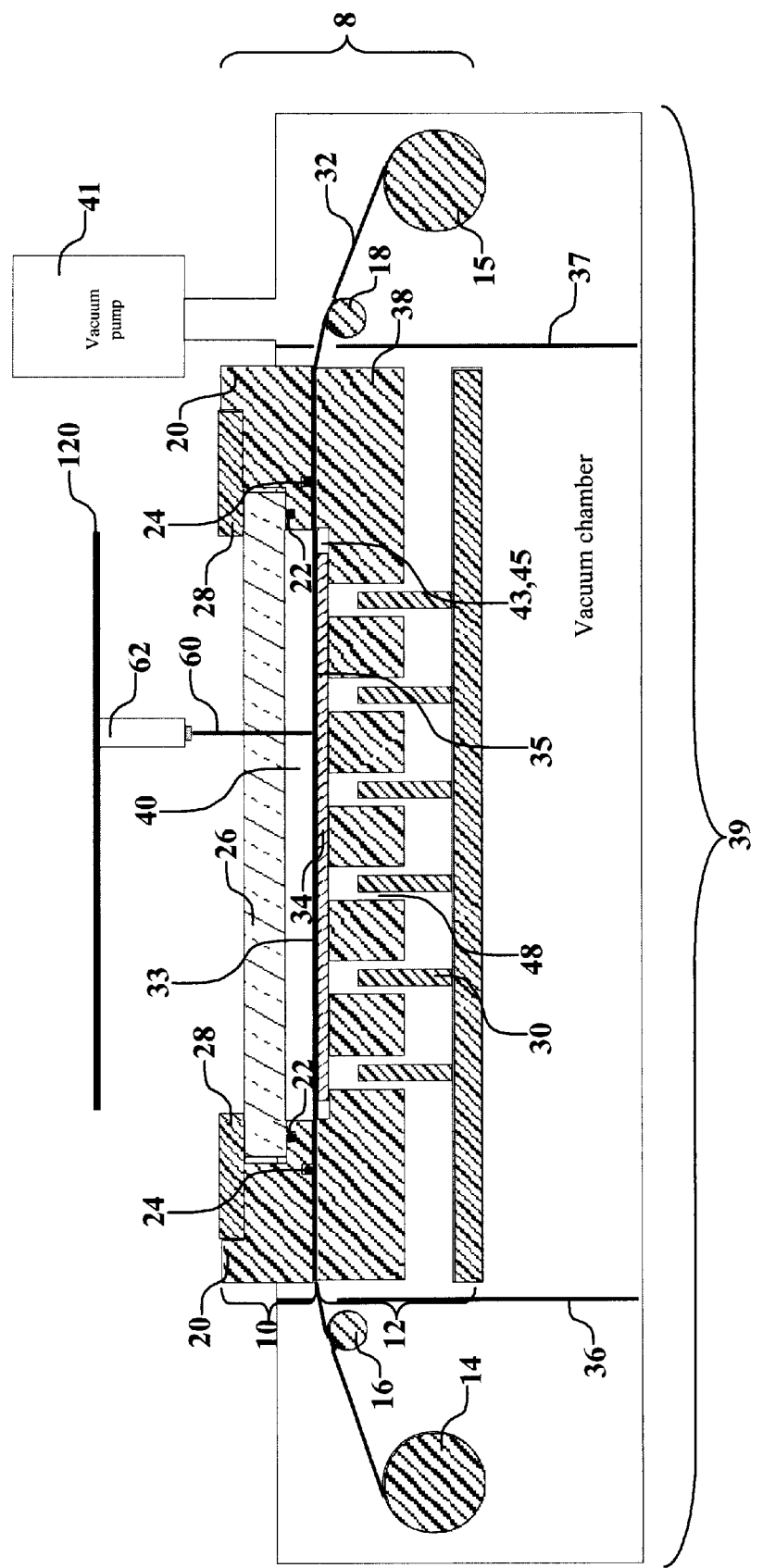
FIG. 2 is a cross-sectional representation of the aforementioned apparatus in closed configuration.

FIG. 2 shows a cross-sectional representation of the aforementioned apparatus 8 in a closed configuration. First fixture 10 and second fixture 12 are aligned with each other so that they engage, form chamber 40 relative to non-transfer surface 33 of donor web 32, and provide pressure along the perimeter of chamber 40, thus clamping donor web 32 and compressing gasket 24, which is a means for providing an airtight seal around the perimeter of chamber 40. At the same time, substrate 34 becomes encapsulated by cavity 43 of plate 38 and donor web 32. Together with the airtight seal formed between top plate 20 and transparent plate 26 with gasket 22, an airtight chamber 40 is formed into which nitrogen, argon, or other gas or fluid can be introduced to apply pressure against non-transfer surface 33 of donor web 32. This pressure creates the appropriate contact between transfer surface 35 of donor web 32 and substrate 34 so that applied radiation will transfer portions of organic material from donor web 32 to substrate 34. A portion of donor web 32 is positioned in chamber 40 at an organic material transfer position, as described above. Second fixture 12 provides a flat surface that, in conjunction with the thickness of substrate 34, and in the case of irradiation by laser, locates an appropriate radiation-absorbing portion (whose nature will become apparent) of donor web 32 within the focal depth of laser light 60 from laser light source 62. In this configuration, channel array 48 serves to maintain vacuum against transfer surface 35 of donor web 32 when gas is introduced to chamber 40.

The space encapsulated by cavity 43 can be called first chamber 45, which is under transfer surface 35 of donor web 32. In this case, chamber 40 can be called second chamber 40 over non-transfer surface 33 of donor web 32. It will be clear that in some embodiments, the positions of first fixture 10 and second fixture 12 can be reversed, and first chamber 45 can be positioned over transfer surface 35 and second chamber 40 can be positioned under non-transfer surface 33. Gasket 24 is a means for providing an airtight seal around the perimeter of second chamber 40. Although not shown, a similar arrangement can provide an airtight seal around the perimeter of first chamber 45.

Figure 3:
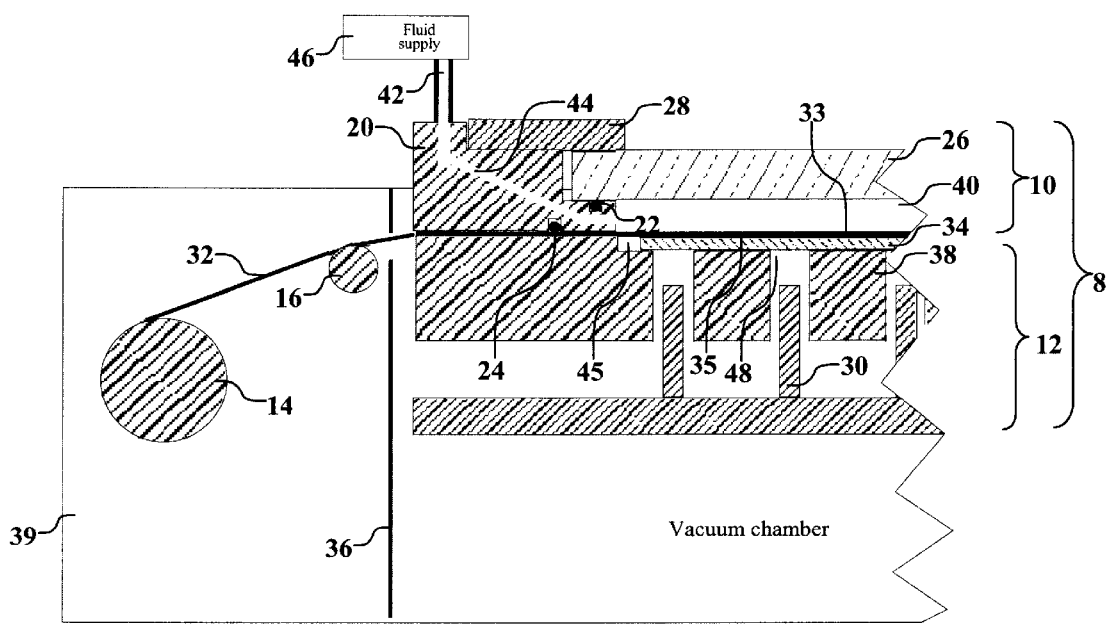
FIG. 3 is a portion of the aforementioned apparatus in closed configuration in greater detail.

FIG. 3 shows a portion of apparatus 8 in closed configuration in greater detail, and shows a means for supplying a fluid to chamber 40 and a means for maintaining ambient pressure between transfer surface 35 of donor web 32 and substrate 34. One or more fluid inlets 42 are formed into top plate 20. They allow the introduction of fluid into fluid passage 44, which conveys it to chamber 40, and can include a means of connection to an external fluid supply 46. The pressure differential between chamber 40 (which applies pressure to non-transfer surface 33 of donor web 32) and the ambient vacuum causes transfer surface 35 of donor web 32 to be pressed against the receiving surface of substrate 34 and thereby ensures the position of donor web 32 relative to substrate 34. Plate 38 (which is a part of second fixture 12) provides a flat surface, as previously described, to locate the appropriate radiation-absorbing portion of donor web 32 within the focal depth of an irradiating laser. The fluid for pressurizing chamber 40 can be a gas (e.g. air, nitrogen, argon, helium), a liquid (e.g. water or a liquid fluorocarbon), a gas that liquefies under pressure (e.g. Freon), or a super-critical fluid (e.g. carbon dioxide). A gas is the preferred fluid, and nitrogen or argon are most preferred. It will be seen that the pressure of fluid in chamber 40 allows a relationship of donor 32 and substrate 34 relative to each other so that a position of direct contact or a controlled separation relative to each other is ensured. It will also be seen that apparatus 8 can be used in other than vacuum conditions, e.g., under dry nitrogen atmosphere above 1 Torr, provided that the pressure delivered to chamber 40 is greater than ambient pressure.

Donor web 32 is clamped against gasket 24 by second fixture 12 when second fixture 12 engages with first fixture 10. This creates first chamber 45 under transfer surface 35 of donor web 32 and chamber 40, also called second chamber 40, over non-transfer surface 33 of donor web 32. One or more channels of channel array 48 in second fixture 12 are open to the ambient environment or surrounding environment, which can be vacuum such as in vacuum chamber 39, in such a way that the airtight seal created at gasket 24 is not disrupted. When fluid pressure is applied to second chamber 40, donor web 32 is pressed against substrate 34, which in turn is pressed against plate 38. The open channel(s) of channel array 48 can maintain ambient pressure conditions on transfer surface 35 of donor web 32 and on substrate 34 in first chamber 45 while non-transfer surface 33 is under relatively greater pressure in second chamber 40. Alternatively, channels other than those of channel array 48 can be constructed, such channels serving solely to maintain ambient pressure conditions in first chamber 45.

Figure 4:
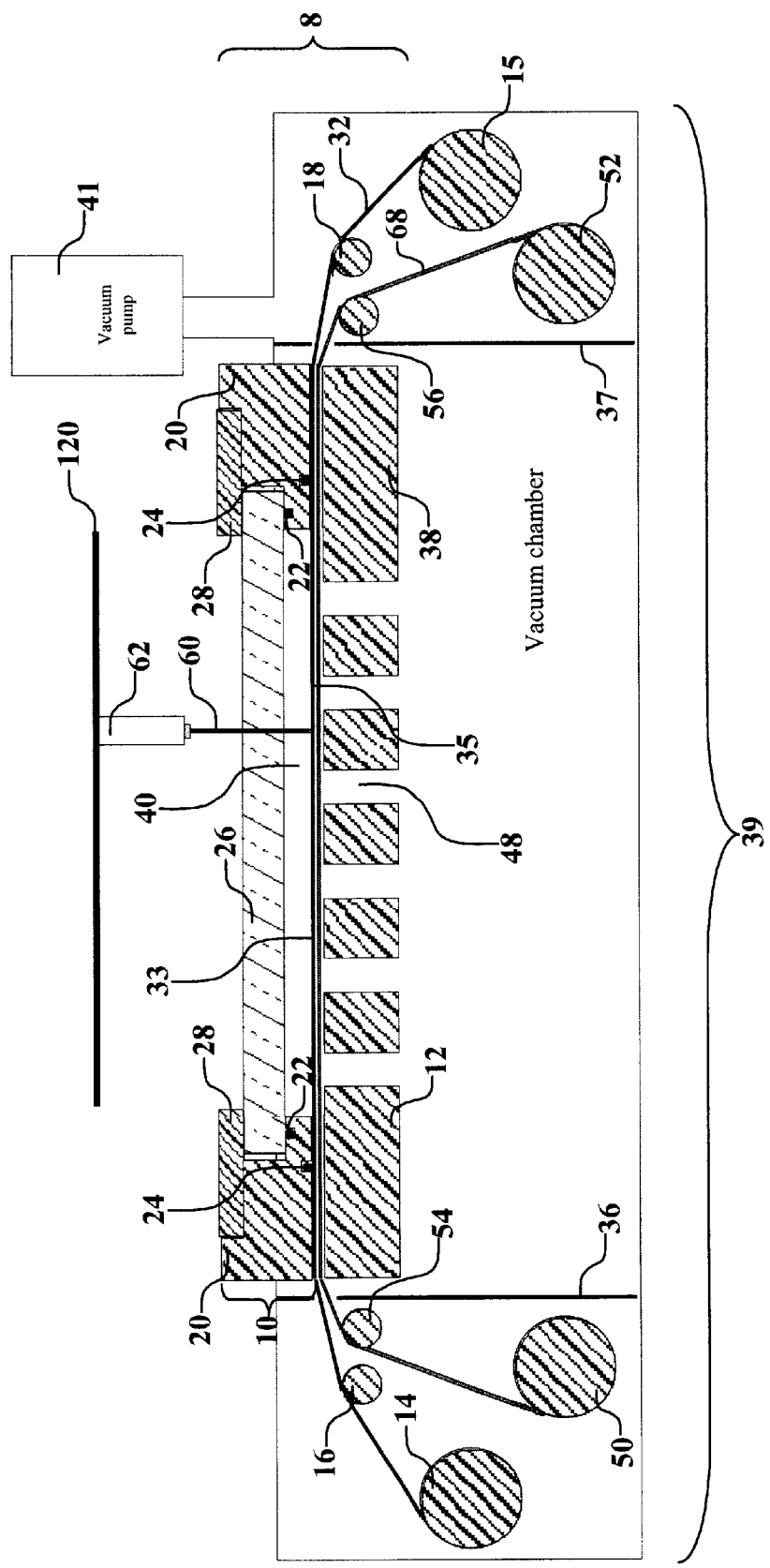
FIG. 4 is a cross-sectional representation of another embodiment of an apparatus designed in accordance with this invention.

FIG. 4 shows a cross-sectional representation of another embodiment of apparatus 8 in a closed configuration designed in accordance with this invention wherein the substrate comprises a web. In such a configuration, a layer of organic material can be formed on one or more OLED devices. In this embodiment, the substrate is flexible substrate web 68, which is pre-wound into substrate roll 50 and spans through apparatus 8 to take-up roll 52, which serves to take-up substrate web 68. When apparatus 8 is in the open position, substrate web 68 can be indexed such that an unexposed portion of substrate web 68 is correctly positioned within apparatus 8. By unexposed portion we mean an area of substrate web 68 to which no organic material transfer has taken place. After a transfer of organic material from donor web 32 to substrate web 68 is complete, apparatus 8 can be opened, and substrate web 68 can be indexed until the next unexposed area is correctly positioned within apparatus 8. At the same time, donor web 32 can be indexed so that the next unused portion is positioned within apparatus 8. By unused portion we mean a portion of donor web 32 where no organic material transfer has taken place. Substrate roll 50 and take-up roll 52 can be mounted on motorized central spindles to facilitate transport of substrate web 68 through apparatus 8. Alternatively, a large roll can rest on supporting rollers. The path of substrate web 68 can also include idler rollers 54 and 56. In addition, idler roller 54 or 56 can include a tension transducer to provide a feedback signal for controlling, for example, the relative rotational speeds of substrate roll 50 and take-up roll 52 for proper tension of substrate web 68. A variety of other rollers for web speed control, web support and guidance, tension isolation, web accumulation, web cooling, web drive and transport, etc. can also be included in the web path.

First fixture 10 and second fixture 12 are aligned with each other so that they engage and provide pressure along the perimeter of chamber 40, thus clamping substrate web 68 and donor web 32 in an organic material transfer position, compressing gasket 24, and creating an airtight seal. Together with the airtight seal formed between top plate 20 and transparent plate 26 with gasket 22, airtight chamber 40 is formed into which nitrogen, argon, or other gas or fluid can be introduced to create pressure against non-transfer surface 33 of donor web 32. This pressure creates the appropriate contact between transfer surface 35 of donor web 32 and substrate web 68 so that applied radiation will transfer portions of donor material 70 from donor web 32 to substrate web 68. Second fixture 12 provides a flat surface that, in conjunction with the thickness of substrate web 68, and in the case of irradiation by laser, locates an appropriate radiation-absorbing portion (whose nature will become apparent) of donor web 32 within the focal depth of laser light 60 from laser light source 62. In this configuration, channel array 48 serves to maintain vacuum against transfer surface 35 of donor web 32.

Figure 5A:
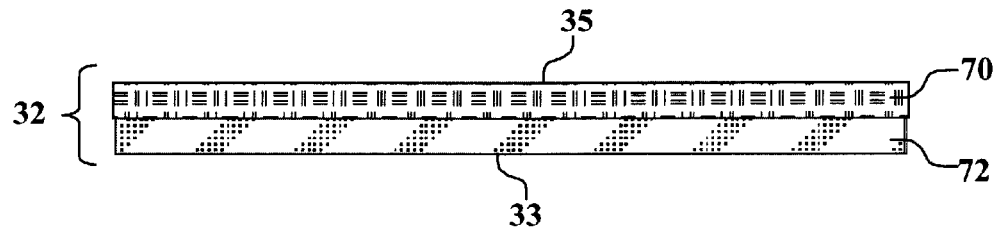
FIG. 5a shows one embodiment of the structure of the donor.

FIG. 5a shows one embodiment of a portion of the structure of donor web 32. Donor web 32 includes at the minimum a support 72 that is preferably flexible, which comprises non-transfer surface 33. Support 72 has been uniformly coated with donor material 70, also called organic material, which comprises transfer surface 35.

The support 72 can be made of any of several materials which meet at least the following requirements: The donor support must be capable of maintaining the structural integrity during the light-to-heat-induced transfer step while pressurized on one side, and during any preheating steps contemplated to remove volatile constituents such as water vapor. Additionally, the donor support must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support can require a multi-step cleaning and surface preparation process prior to precoating with transferable organic material. If the support material permits transmission of radiation, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

A typical OLED device may contain the following layers, usually in this sequence: an anode; a hole-injecting layer; a hole-transporting layer; a light-emitting layer; an electron-transporting layer; a cathode. Donor material 70 can include a hole-injecting material, a hole-transporting material, an electron-transporting material, a light-emitting material, a host material, or a combination of any of these materials. These materials are described below.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting (HT) Material

Hole-transporting materials useful as organic material 70 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

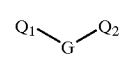

A wherein:

Q$_1$ and Q$_2$ are independently selected aromatic tertiary amine moieties; and G is a linking group such as an arylene, cycloalkylene, or alkylene group of a carbon to carbon bond.

In one embodiment, at least one of Q$_1$ or Q$_2$ contains a polycyclic fused ring structure, e.g., a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B):

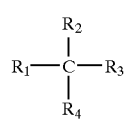

B where:

R$_1$ and R$_2$ each independently represents a hydrogen atom, an aryl group, or an alkyl group or R$_1$ and R$_2$ together represent the atoms completing a cycloalkyl group; and R$_3$ and R$_4$ each independently represent an aryl group, which is in turn substituted with a diaryl substituted amino group, as indicated by structural Formula (C).

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

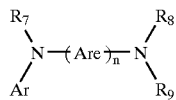
D wherein:
each Are is an independently selected arylene group, such as a phenylene or anthracene moiety,
n is an integer of from 1 to 4, and
Ar, R$_7$, R$_8$, and R$_9$ are independently selected aryl groups. In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
Poly(N-vinylcarbazole), and
N,N'-di-1-naphthalenyl-N,N'-diphenyl-4,4'-diaminobiphenyl.

4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Material

Light-emitting materials useful as donor material 70 are well known. Such donor materials can comprise components to make a light-emitting layer in an OLED device. As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The donor material and the light-emitting layer produced from it can be comprised of a single material, but more commonly consists of two or more components, e.g. a host material doped with a light-emitting guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755;999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

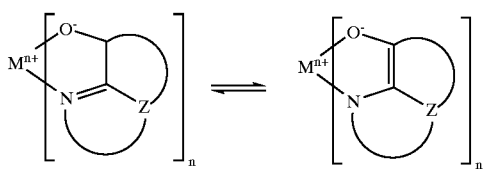

E wherein;

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-□-oxo-bis(2-methyl-8-quinolinolato)aluminum(III)

CO-5: Indium trisoxine [alias, tris(8-quinolinolato)indium]

CO-6: Aluminum tris(5-methyloxine)[alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

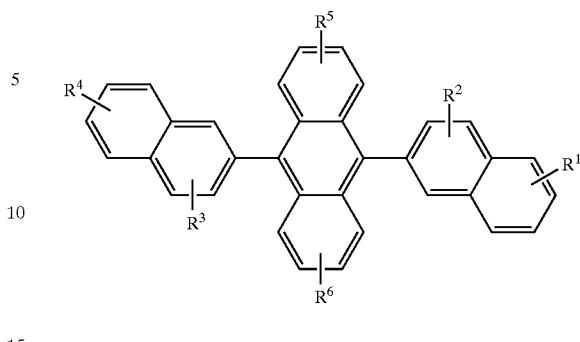

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

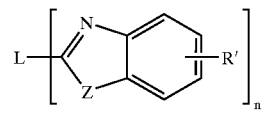

G where:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

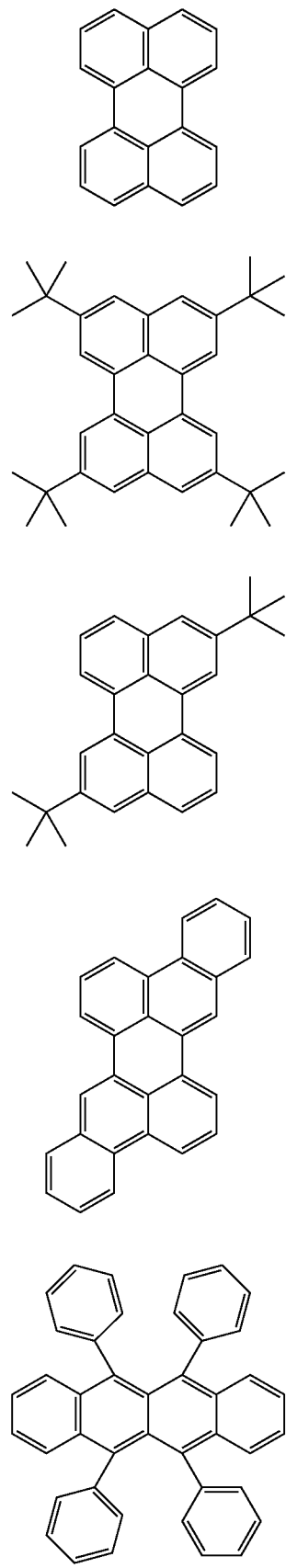
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

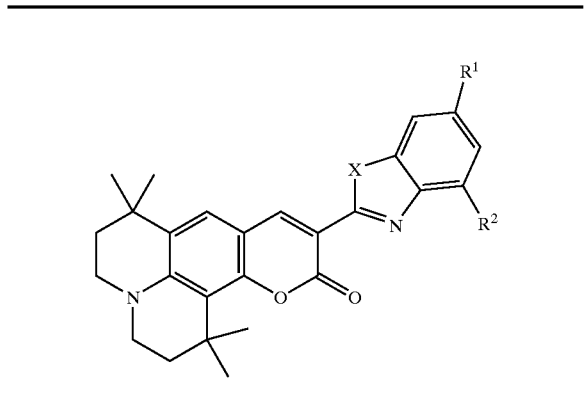
|     | X | R1     | R2     |
|-----|---|--------|--------|
| L23 | O | H      | H      |
| L24 | O | H      | Methyl |
| L25 | O | Methyl | H      |
| L26 | O | Methyl | Methyl |
| L27 | O | H      | t-butyl|
| L28 | O | t-butyl| H      |
| L29 | O | t-butyl| t-butyl|
| L30 | S | H      | H      |
| L31 | S | H      | Methyl |
| L32 | S | Methyl | H      |
| L33 | S | Methyl | Methyl |
| L34 | S | H      | t-butyl|
| L35 | S | t-butyl| H      |
| L36 | S | t-butyl| t-butyl|
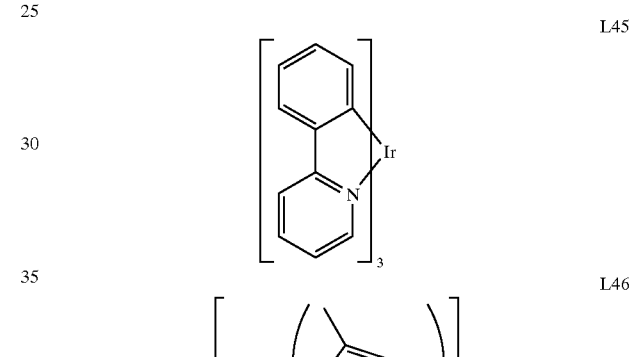
|     | R       |
|-----|---------|
| L37 | phenyl  |
| L38 | methyl  |
| L39 | t-butyl |
| L40 | mesityl |
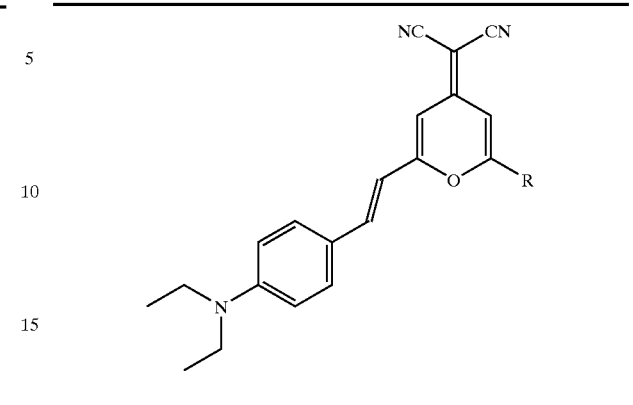
|     | R       |
|-----|---------|
| L41 | phenyl  |
| L42 | methyl  |
| L43 | t-butyl |
| L44 | mesityl |
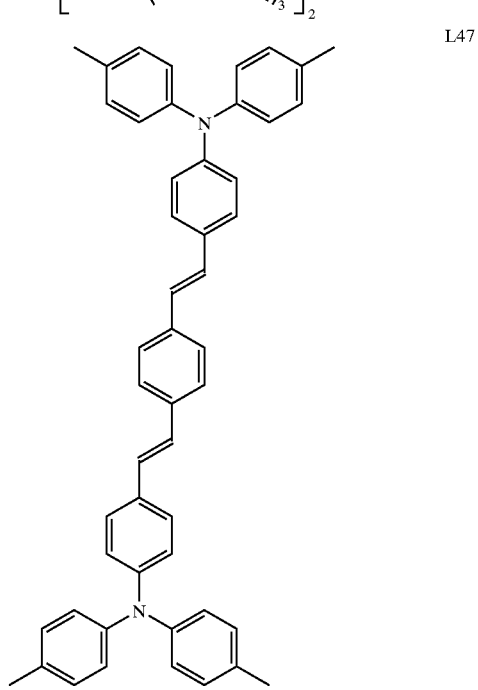

-continued

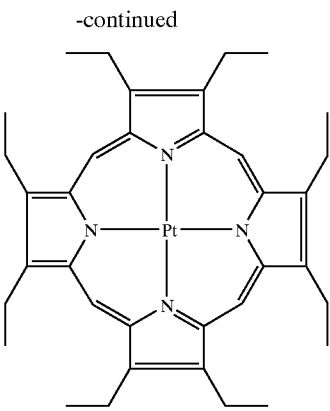

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Electron-Transporting (ET) Material

Preferred electron-transporting materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (G) are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

In some instances, a single layer can serve the function of supporting both light emission and electron transportation, and will therefore include emissive material and electron-transporting material.

Donor web 32 must also include a radiation-absorbing material, which is, in this embodiment, incorporated into donor material 70 or support 72. Radiation-absorbing material can be a dye such as the dyes specified in U.S. Pat. No. 5,578,416, a pigment such as carbon, or a metal such as nickel, titanium, etc.

In the case wherein donor material 70 is a light-emitting material, different portions of donor web 32 can have different donor materials 70 that emit light in different regions of the spectrum. For example, a portion or series of portions of donor web 32 can be coated with donor material 70 that emits red light. A second portion or series of portions of donor web 32 can be coated with donor material 70 that emits green light. A third portion or series of portions of donor web 32 can be coated with donor material 70 that emits blue light. The above different portions of donor web 32 can sequentially be placed in an organic material transfer position with a given substrate 34, and thus can be used to transfer light-emitting materials with different-colored emissions in the preparation of a full-color OLED device.

Figure 5B:
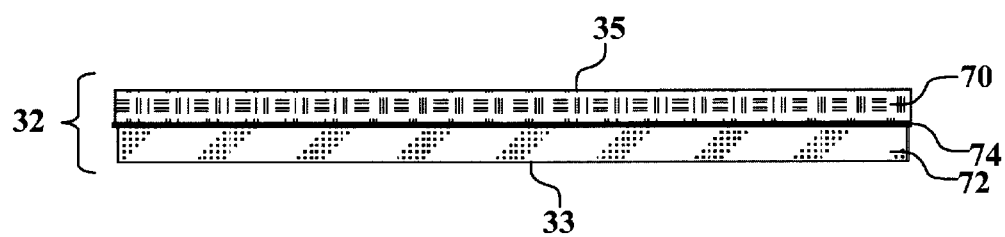
FIG. 5b shows another embodiment of the structure of the donor.

FIG. 5b shows another embodiment of the structure of donor web 32. In this embodiment, support 72 is first uniformly coated with radiation-absorbing material 74 capable of absorbing radiation in a predetermined portion of the spectrum for producing heat, then coated with donor material 70. Support 72 then comprises non-transfer surface 33 and donor material 70 comprises transfer surface 35. Non-transfer surface 33 of donor web 32 permits transmission of radiation to radiation-absorbing material 74, which is capable of absorbing radiation in a predetermined portion of the spectrum and producing heat in such material. Radiation-absorbing material 74 can be a dye such as the dyes specified in U.S. Pat. No. 5,578,416, a pigment such as carbon, or a metal such as nickel, chromium, titanium, etc.

Figure 5C:
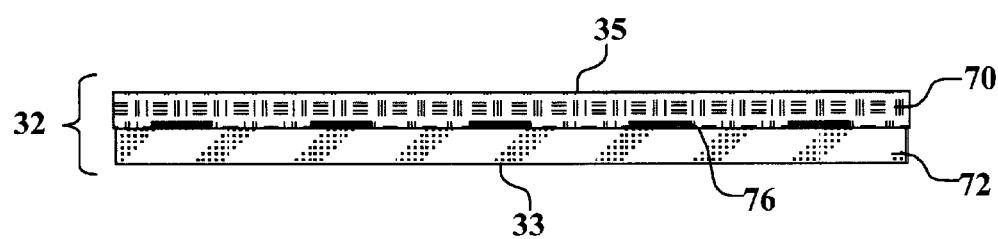
FIG. 5c shows another embodiment of the structure of the donor.

FIG. 5c shows another embodiment of the structure of donor web 32. In this embodiment, support 72 is first coated with radiation-absorbing patterned layer 76, that is, radiation-absorbing material in the form of a patterned layer capable of absorbing radiation in a predetermined portion of the spectrum for producing heat, then with donor material 70. Radiation-absorbing patterned layer 76 is selected to cause a patterned transfer of donor material 70. Support 72 then comprises non-transfer surface 33 and donor material 70 comprises transfer surface 35. Radiation-absorbing patterned layer 76 includes radiation-absorbing material capable of absorbing radiation in a predetermined portion of the spectrum and producing heat.

Figure 6A:
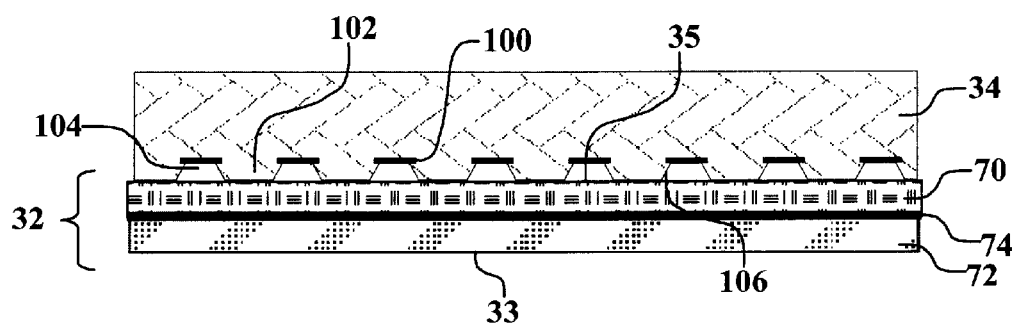
FIG. 6a shows a cross-section view of one embodiment of the placement of the donor against the substrate in accordance with this invention.

FIG. 6a shows a cross-section view of one embodiment of the placement of donor web 32 in a relationship relative to substrate 34 so that there will be a separation between portions of substrate 34 and donor web 32 in accordance with this invention. In this embodiment, receiving surface 106 of substrate 34 is uneven due to the presence of thin-film transistors 100. Thin-film transistors 100 are separated in substrate 34 by raised surface portions 102 as a result of the multilayer construction of each pixel or subpixel. This is described by Tang in commonly assigned U.S. Pat. No. 5,937,272, the contents of which are incorporated by reference. The presence of raised surface portions 102 maintains the separation of gap 104 against the pressure that is exerted by the pressurizing fluid against non-transfer surface 33 and maintains the separation between portions of donor web 32 and substrate 34.

Figure 6B:
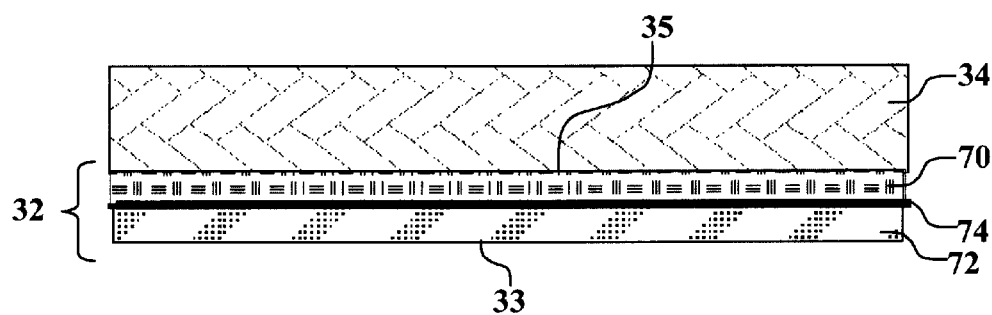
FIG. 6b shows a cross-section view of another embodiment of the placement of the donor against the substrate in accordance with this invention.

FIG. 6b shows a cross-section view of another embodiment of the placement of donor web 32 in a relationship relative to substrate 34 so that substrate 34 and donor web 32 will be in contact in accordance with this invention. In this embodiment, transfer surface 35 of donor web 32 is held in full contact with substrate 34 by the pressure that is exerted by the pressurizing fluid against non-transfer surface 33.

Figure 7A:
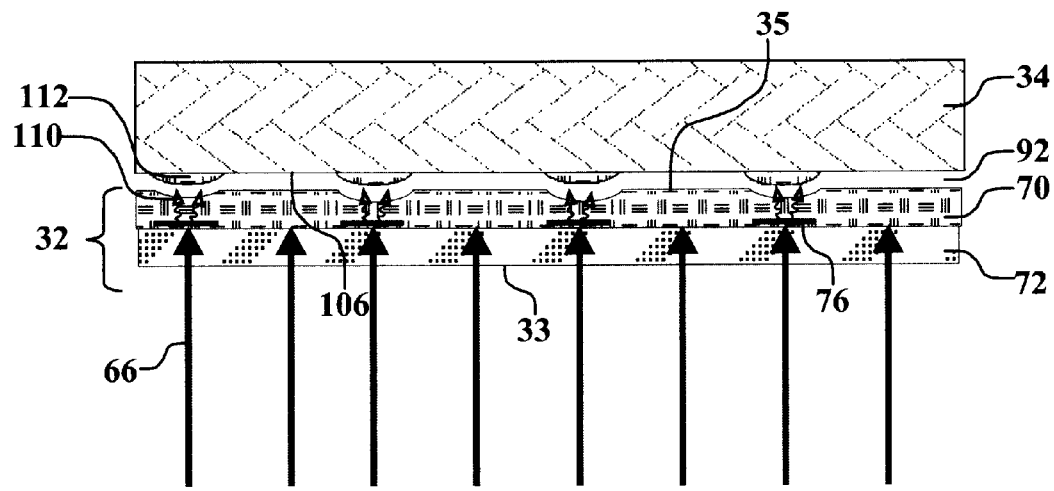
FIG. 7a shows a cross-sectional representation of the transfer of organic material from donor to substrate by one method of treatment with light.

FIG. 7a shows a cross-sectional representation of the transfer of organic material or donor material 70 from donor web 32 onto portions of substrate 34 by one method of treatment with radiation to form a layer of organic material on substrate 34. In this embodiment, donor web 32 has been prepared with radiation-absorbing patterned layer 76. Radiation as flash light 66 irradiates non-transfer surface 33 of donor web 32 and strikes radiation-absorbing patterned layer 76, producing heat 110 which will cause the transfer of organic material 70 in the immediate vicinity of radiation-absorbing patterned layer 76, so that desired portions of organic material 70 will transfer from donor web 32 across gap 92 to substrate 34 in a patterned transfer. In this embodiment, appropriate transfer of organic material 70 is effected by radiation-absorbing patterned layer 76 so that only the desired portions of organic material 70 are transferred. Only a portion of the light impinging on donor web 32 (i.e. that which impinges directly on radiation-absorbing patterned layer 76) will be converted to heat. Some or all of the heated portion of donor material 70 is sublimed, vaporized, or ablated and becomes transferred organic material 112 on receiving surface 106 of substrate 34 in a patterned transfer.

Figure 7B:
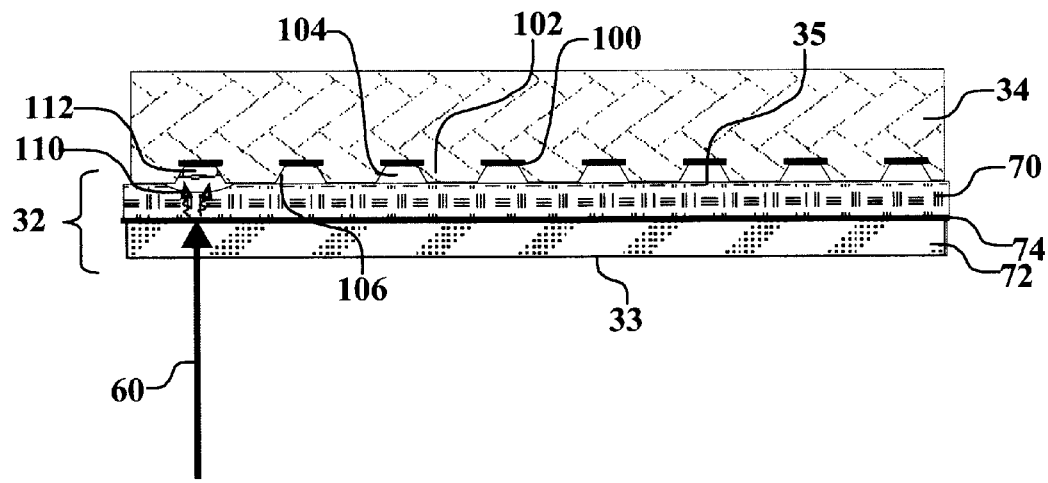
FIG. 7b shows a cross-sectional representation of the transfer of organic material from donor to substrate by another method of treatment with light.

FIG. 7b shows a cross-sectional representation of the transfer of organic material or donor material 70 from donor web 32 onto portions of substrate 34 by another method of treatment with radiation to form a layer of organic material on substrate 34. In this embodiment, donor web 32 has been prepared with radiation-absorbing material 74 and gap 104 is maintained by the structure of thin-film transistors 100 and raised surface portions 102. Radiation in a pattern of laser light 60 irradiates non-transfer surface 33 of donor web 32 and strikes radiation-absorbing material 74, producing heat 110 which will cause the transfer of organic material 70 in the immediate vicinity of laser light 60, so that desired portions of organic material 70 will transfer from donor web 32 to substrate 34. In this embodiment, appropriate transfer of organic material 70 is effected by control of laser light 60 so that only the desired portions of organic material 70 are transferred. A large portion of the light impinging on donor web 32 will be converted to heat, but this will only happen at selectively irradiated portions of donor web 32. Some or all of the heated portion of donor material 70 is sublimed, vaporized, or ablated and becomes transferred organic material 112 on receiving surface 106 of substrate 34 in a patterned transfer.

Figure 8:
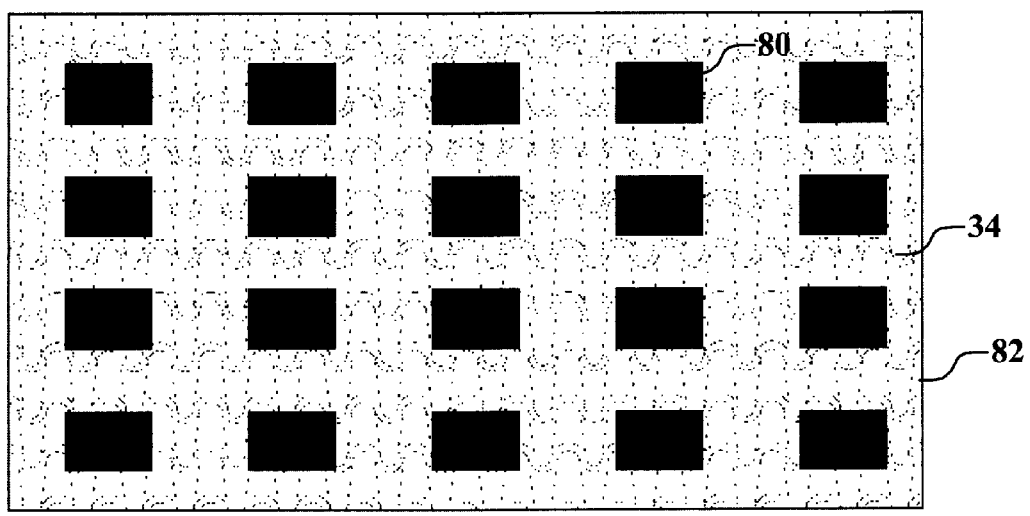
FIG. 8 shows a plan view of the treated substrate.

Turning now to FIG. 8, and referring also to FIGS. 7a and 7b, there is shown a plan view of treated substrate 82, which has been treated in the manner described in this invention. Predetermined portions of donor material 70 have been transferred to substrate 34 in transferred pattern 80. Transferred pattern 80 has been formed in a manner consistent with the end-use of treated substrate 82 (e.g. transferred pattern 80 is of an OLED light-emissive material that has been transferred to the positions of existing thin-film transistors on substrate 34). Transferred pattern 80 reflects the method used to prepare it (e.g. radiation-absorbing patterned layer 76 in FIG. 7a or the pattern of laser light 60 irradiation in FIG. 7b).

It shall be understood that first fixture 10 can be arranged to be in a position to perform some or all of the functions of second fixture 12, and second fixture 12 can perform some or all of the functions of first fixture 10.

The invention has been described in detail with particular reference to certain preferred embodiments thereof, but it will be understood that variations and modifications can be effected within the spirit and scope of the invention.

PARTS LIST

| | |
|---|---|
| 8 | apparatus |
| 10 | first fixture |
| 12 | second fixture |
| 14 | donor roll |
| 15 | take-up roll |
| 16 | idler roller |
| 18 | idler roller |
| 19 | digital image |
| 20 | top plate |
| 21 | computer |
| 22 | gasket |
| 23 | digital/analog converter |
| 24 | gasket |
| 25 | digital/analog converter |
| 26 | transparent portion |
| 27 | web moving means |
| 28 | retaining clamp |
| 30 | pin array |
| 32 | donor web |
| 33 | non-transfer surface |
| 34 | substrate |
| 35 | transfer surface |
| 36 | gate valve |
| 37 | gate valve |
| 38 | plate |
| 39 | vacuum chamber |
| 39a | feed chamber |
| 39b | transfer chamber |
| 39c | take-up chamber |
| 40 | chamber or second chamber |
| 41 | vacuum pump |
| 42 | fluid inlet |
| 43 | cavity |
| 44 | fluid passage |
| 45 | first chamber |
| 46 | fluid supply |
| 48 | channel array |
| 50 | substrate roll |
| 52 | take-up roll |
| 54 | idler roller |
| 56 | idler roller |
| 60 | laser light |
| 62 | laser light source |
| 66 | flash light |
| 68 | substrate web |
| 70 | donor material or organic material |
| 72 | support |
| 74 | radiation-absorbing material |
| 76 | radiation-absorbing patterned layer |
| 80 | transferred pattern |
| 82 | treated substrate |
| 92 | gap |
| 100 | thin-film transistor |
| 102 | raised surface portion |
| 104 | gap |
| 106 | receiving surface |
| 110 | heat |
| 112 | transferred organic material |
| 120 | micropositioning device |

What is claimed is:

1. Apparatus for transferring organic material from a donor web onto a substrate to form a layer of organic material on one or more OLED devices, comprising:

a) a web of donor material;

b) a first fixture arranged to engage the donor web and substrate in a relationship relative to one another whereby there will be either a separation between portions of the substrate and the donor web, or the substrate and donor web will be in contact, and wherein organic material will be transferred onto portions of the substrate;

c) a second fixture aligned with and engaging the first fixture to clamp the donor web and substrate and forming a chamber relative to a non-transfer surface of the donor web;

d) means for moving the donor web to position a portion of the donor web in the chamber at an organic material transfer position;

e) means for supplying a fluid to the chamber to apply pressure to the non-transfer surface of the donor web so as to ensure the position of the donor web relative to the substrate;

f) the first fixture including a transparent portion located in relationship to the non-transfer surface of the donor web to permit transmission of radiation through such transparent portion to the non-transfer surface of the donor web so that heat will be produced and the organic material will transfer from the donor web to the substrate; and g) means including a laser light source that is directed through the transparent portion to illuminate the donor web in a pattern which will cause the appropriate transfer of the organic material to the substrate.

2. The apparatus of claim 1 wherein the fluid is a gas or liquid.

3. The apparatus of claim 1 further including means for controlling the web moving means and for actuating the laser light source.

4. The apparatus of claim 1 wherein the donor web includes portions which have different organic material that emit light in different regions of the spectrum.

5. The apparatus of claim 1 wherein the substrate comprises a web.

6. Apparatus for transferring organic material from a donor web onto a substrate to form a layer of organic material on one or more OLED devices, comprising:

a) a web of donor material including radiation-absorbing material capable of absorbing radiation in a predetermined portion of the spectrum for producing heat which will cause the transfer of organic material;

b) a first fixture arranged to engage the donor web and substrate in a relationship relative to one another whereby there will be either a separation between portions of the substrate and the donor web, or the substrate and donor web will be in contact, and wherein organic material will be transferred onto portions of the substrate;

c) a second fixture aligned with and engaging the first fixture to clamp the donor web and substrate and forming a chamber relative to a non-transfer surface of the donor web;

d) means for moving the donor web to position a portion of the donor web in the chamber at an organic material transfer position;

e) means for providing an airtight seal around the perimeter of the chamber;

f) means for supplying a fluid to the chamber to apply pressure to the non-transfer surface of the donor web so as to ensure the position of the donor web relative to the substrate;

g) the first fixture including a transparent portion located in relationship to the non-transfer surface of the donor web to permit transmission of radiation through such transparent portion and the non-transfer surface of the donor web to the radiation-absorbing material so that heat will be produced in such material and the organic material will transfer from the donor web to the substrate; and h) means including a laser light source that is directed through the transparent portion to illuminate the donor web in a pattern which will cause the appropriate transfer of the organic material to the substrate.

7. The apparatus of claim 6 wherein the fluid is a gas or liquid.

8. The apparatus of claim 6 further including means for controlling the web moving means and for actuating the laser light source.

9. The apparatus of claim 6 wherein the donor web includes portions which have different organic material that emit light in different regions of the spectrum.

10. The apparatus of claim 6 wherein the substrate comprises a web.

11. The apparatus of claim 6 wherein the organic material includes a hole-injecting material, hole-transporting material, electron-transporting material, light-emitting material, a host material or combination thereof.

12. The apparatus of claim 11 wherein the organic material comprises components to make a light-emitting layer including at least one host material and at least one light-emitting material.

13. The apparatus of claim 6 wherein the radiation-absorbing material is in the form of a patterned layer selected to cause a patterned transfer of organic material.

14. The apparatus of claim 6 further including a vacuum chamber and wherein the apparatus is provided in such vacuum chamber.

15. Apparatus for transferring organic material from a donor web onto a substrate to form a layer of organic material on one or more OLED devices, comprising:

a) a web of donor material including radiation-absorbing material capable of absorbing radiation in a predetermined portion of the spectrum for producing heat which will cause the transfer of organic material;

b) a first fixture arranged to engage the donor web and substrate in a relationship relative to one another whereby there will be either a separation between portions of the substrate and the donor web, or the substrate and donor web will be in contact, and wherein organic material will be transferred onto portions of the substrate;

c) a second fixture aligned with and engaging the first fixture to clamp the donor web and forming a first chamber under the transfer surface of the donor web and a second chamber over the non-transfer surface of the donor web;

d) means for moving the donor web to position a portion of the donor web in the chamber at an organic material transfer position;

e) means for providing an airtight seal around the perimeter of the first and second chambers;

f) means for supplying a fluid to the second chamber to apply pressure to the non-transfer surface of the donor web so as to ensure the position of the donor web relative to the substrate;

g) the first fixture including a transparent portion located in relationship to the non-transfer surface of the donor web to permit transmission of radiation through such transparent portion and the non-transfer surface of the donor web to the radiation-absorbing material so that heat will be produced in such material and the organic material will transfer from the donor web to the substrate; and h) means including a laser light source that is directed through the transparent portion to illuminate the donor web in a pattern which will cause the appropriate transfer of the organic material to the substrate.

16. The apparatus of claim 15 wherein the fluid is a gas or liquid.

17. The apparatus of claim 15 further including means for controlling the web moving means and for actuating the laser light source.

18. The apparatus of claim 15 wherein the donor web includes portions which have different organic material that emit light in different regions of the spectrum.

19. The apparatus of claim 15 wherein the substrate comprises a web.

20. The apparatus of claim 15 wherein the organic material includes a hole-injecting material, hole-transporting material, electron-transporting material, light-emitting material, a host material or combination thereof.

21. The apparatus of claim 20 wherein the organic material comprises components to make a light-emitting layer including at least one host material and at least one light-emitting material.

22. The apparatus of claim 15 wherein the radiation-absorbing material is in the form of a patterned layer selected to cause a patterned transfer of organic material.

23. The apparatus of claim 15 further including a vacuum chamber and wherein the apparatus is provided in such vacuum chamber.

* * * * *